United States Patent
Lu

(10) Patent No.: US 12,506,073 B2
(45) Date of Patent: Dec. 23, 2025

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventor: Zhiyuan Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 417 days.

(21) Appl. No.: 18/155,066

(22) Filed: Jan. 17, 2023

(65) Prior Publication Data

US 2024/0071922 A1 Feb. 29, 2024

(30) Foreign Application Priority Data

Aug. 23, 2022 (CN) .......................... 202211013638.X

(51) Int. Cl.
| | |
|---|---|
| H01L 23/528 | (2006.01) |
| G11C 5/06 | (2006.01) |
| H10B 12/00 | (2023.01) |

(52) U.S. Cl.
CPC ............ *H01L 23/5283* (2013.01); *G11C 5/06* (2013.01); *H10B 12/0335* (2023.02); *H10B 12/33* (2023.02)

(58) Field of Classification Search
CPC .. H10B 12/33; H10B 12/0335; H01L 23/5283
See application file for complete search history.

(56) References Cited

U.S. PATENT DOCUMENTS

| | | | | |
|---|---|---|---|---|
| 6,479,899 | B1 * | 11/2002 | Fukuda | H10B 12/00 |
| | | | | 257/306 |
| 2002/0137281 | A1 * | 9/2002 | Watanabe | H10B 12/033 |
| | | | | 257/E21.654 |
| 2004/0173836 | A1 * | 9/2004 | Oh | H10B 12/482 |
| | | | | 257/E27.087 |

FOREIGN PATENT DOCUMENTS

TW 445590 B 7/2001

* cited by examiner

*Primary Examiner* — Douglas M Menz
(74) *Attorney, Agent, or Firm* — Kilpatrick Townsend & Stockton LLP

(57) ABSTRACT

Embodiments provide a semiconductor structure and a fabricating method. The structure includes: a substrate including a capacitor structure and a peripheral device structure; a first wiring layer including a first wiring sub-layer and a second wiring sub-layer, a first conductive plug including a first conductive sub-plug and a second conductive sub-plug, where the first wiring sub-layer is positioned above the peripheral device structure, a terminal of the first conductive sub-plug is electrically connected to the first wiring sub-layer, other terminal of the first conductive sub-plug is electrically connected to the peripheral device structure, the second wiring sub-layer is positioned above the first wiring sub-layer, a terminal of the second conductive sub-plug is electrically connected to the second wiring sub-layer, and other terminal of the second conductive sub-plug is electrically connected to the first wiring sub-layer or the peripheral device structure; and a second wiring layer positioned above the capacitor structure.

20 Claims, 3 Drawing Sheets

SEMICONDUCTOR STRUCTURE AND METHOD FOR FABRICATING SAME

CROSS-REFERENCE TO RELATED APPLICATION

This application claims priority to Chinese Patent Application No. 202211013638.X, titled "SEMICONDUCTOR STRUCTURE AND METHOD FOR FABRICATING SAME" and filed to the State Patent Intellectual Property Office on Aug. 23, 2022, the entire contents of which are incorporated herein by reference.

TECHNICAL FIELD

Embodiments of the present disclosure relate to the field of semiconductors, and more particularly, to a semiconductor structure and a method for fabricating the same.

BACKGROUND

With a development trend of various electronic products toward miniaturization, design of a dynamic random access memory (DRAM) cell also need to meet requirements of high integration and high density.

An array region of the DRAM is formed by aggregating a large number of memory cells, and each memory cell includes one memory transistor and one capacitor connected in series. A peripheral region of the DRAM is positioned at a periphery of the array region, and the peripheral region includes other transistor elements and contact structures, etc. Generally, the capacitor positioned in the array region has a larger height to have better charge storage efficiency. After a dielectric layer is formed to cover the peripheral region and the array region simultaneously, conductive plugs need to be formed in the peripheral region for rewiring and electrical connection with devices in the array region. Therefore, it is necessary to form higher conductive plugs penetrating through a thicker dielectric layer in the peripheral region, and a high-density integrated device reduces a pitch between the corresponding conductive plugs, which generally results in a problem of short-circuiting the conductive plugs, thereby causing damage to the devices in the peripheral region.

SUMMARY

Embodiments of the present disclosure provide a semiconductor structure and a method for fabricating the same.

According to some embodiments of the present disclosure, one aspect of the embodiments of the present disclosure provides a semiconductor structure, comprising: a substrate comprising a peripheral region and an array region, where the array region has capacitor structures, the peripheral region has peripheral device structures, and a top surface of each of the capacitor structures is higher than a top surface of each of the peripheral device structures; a first wiring layer and a first conductive plug, where the first wiring layer at least comprises a first wiring sub-layer and a second wiring sub-layer, the first conductive plug at least comprises a first conductive sub-plug and a second conductive sub-plug, the first wiring sub-layer is positioned above each of the peripheral device structures, the first conductive sub-plug is positioned between the first wiring sub-layer and a given one of the peripheral device structures, a terminal of the first conductive sub-plug is electrically connected to the first wiring sub-layer, other terminal of the first conductive sub-plug is electrically connected to the given one of the peripheral device structures, the second wiring sub-layer is positioned above the first wiring sub-layer, the second conductive sub-plug is positioned between the second wiring sub-layer and the given one of the peripheral device structures, a terminal of the second conductive sub-plug is electrically connected to the second wiring sub-layer, and other terminal of the second conductive sub-plug is electrically connected to the first wiring sub-layer or the given one of the peripheral device structures; and a second wiring layer and a second conductive plug, where the second wiring layer is positioned above each of the capacitor structures and the first wiring layer, the second conductive plug is positioned between the second wiring layer and the substrate, a terminal of the second conductive plug is electrically connected to the second wiring layer, and other terminal of the second conductive plug is electrically connected to a given one of the capacitor structures or the second wiring sub-layer. A top surface of the first wiring layer is lower than the top surface of each of the capacitor structures.

According to some embodiments of the present disclosure, another aspect of the embodiments of the present disclosure also provides a method for fabricating a semiconductor structure. The method includes: providing a substrate, where the substrate includes a peripheral region and an array region, and the peripheral region includes peripheral device structures; forming a first wiring layer and a first conductive plug, where the first wiring layer at least includes a first wiring sub-layer and a second wiring sub-layer, the first conductive plug at least includes a first conductive sub-plug and a second conductive sub-plug, the first wiring sub-layer is positioned above each of the peripheral device structures, the first conductive sub-plug is positioned between the first sub-wiring layer and a given one of the peripheral device structures, a terminal of the first conductive sub-plug is electrically connected to the first wiring sub-layer, other terminal of the first conductive sub-plug is electrically connected to the given one of the peripheral device structures, the second wiring sub-layer is positioned above the first wiring sub-layer, the second conductive sub-plug is positioned between the second wiring sub-layer and the given one of the peripheral device structures, a terminal of the second conductive sub-plug is electrically connected to the second wiring sub-layer, and other terminal of the second conductive sub-plug is electrically connected to the first wiring sub-layer or the given one of the peripheral device structures; forming a capacitor structure positioned in the array region, where a top surface of the first wiring layer is lower than a top surface of each of the capacitor structures; and forming a second wiring layer and a second conductive plug, where the second wiring layer is positioned above each of the capacitor structures and the first wiring layer, the second conductive plug is positioned between the second wiring layer and the substrate, a terminal of the second conductive plug is electrically connected to the second wiring layer, and other terminal of the second conductive plug is electrically connected to a given one of the capacitor structures or the second wiring sub-layer.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, a higher conductive plug needs to be formed in a peripheral region to penetrate through a thicker dielectric layer, and a high-density integrated device reduces a pitch between corresponding conductive plugs, which generally results in short circuit of the conductive plugs, thereby causing damages to devices in the peripheral region.

After analysis, it is found that when the conductive plugs are fabricated in the peripheral region to be rewired and electrically connected to device structures in an array region, because the array region has a higher capacitor structure, a height difference between the peripheral region and the array region is greater, and accordingly, the conductive plugs in the peripheral region need to be fabricated for a greater height. Moreover, dimensions of the devices in a semiconductor structure are gradually reduced, a pitch between the corresponding devices of the semiconductor structure is reduced accordingly, and the pitch between the conductive plugs is shortened. Generally, when conductive plug holes are formed by etching, etching difficulty is accordingly increased due to increase of an etching depth, diameters of the conductive plug holes gradually decrease from top to bottom, and the diameters of the conductive plugs formed gradually increase from bottom to top. When heights of the conductive plugs are greater and the pitch between the conductive plugs is closer, the conductive plugs are gradually short-circuited from bottom to top, thereby causing damages to the peripheral device structure.

According to some embodiments of the present disclosure, one aspect of the embodiments of the present disclosure provides a semiconductor structure to improve the problem of short circuit of the conductive plugs in the peripheral region.

The embodiments of the present disclosure will be described in detail below in conjunction with the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

Figure 1:
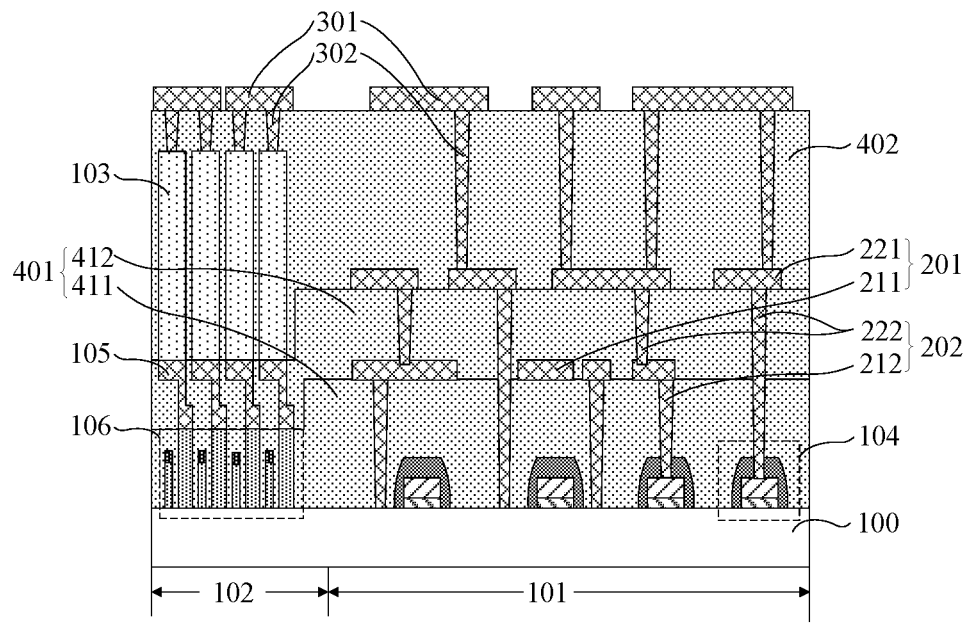
FIG. 1 is a schematic diagram of a semiconductor structure according to an embodiment of the present disclosure.

FIG. 1 is a schematic diagram of a semiconductor structure according to an embodiment of the present disclosure. The semiconductor structure provided in this embodiment is described in detail below with reference to the accompanying drawings, and details are as follows.

Referring to FIG. 1, the semiconductor structure includes: a substrate 100 comprising a peripheral region 101 and an array region 102, where the array region 102 has capacitor structures 103, the peripheral region 101 has peripheral device structures 104, and a top surface of each of the capacitor structures 103 is higher than a top surface of each of the peripheral device structures 104; a first wiring layer 201 and a first conductive plug 202, where the first wiring layer 201 at least comprises a first wiring sub-layer 211 and a second wiring sub-layer 221, the first conductive plug 202 at least comprises a first conductive sub-plug 212 and a second conductive sub-plug 222, the first wiring sub-layer 211 is positioned above a given one of the peripheral device structures 104, the first conductive sub-plug 212 is positioned between the first wiring sub-layer 211 and the given one of the peripheral device structures 104, a terminal of the first conductive sub-plug 212 is electrically connected to the first wiring sub-layer 211, other terminal of the first conductive sub-plug 212 is electrically connected to the given one of the peripheral device structures 104, the second wiring sub-layer 221 is positioned above the first wiring sub-layer 211, the second conductive sub-plug 222 is positioned between the second wiring sub-layer 221 and the given one of the peripheral device structures 104, a terminal of the second conductive sub-plug 222 is electrically connected to the second wiring sub-layer 221, and other terminal of the second conductive sub-plug 222 is electrically connected to the first wiring sub-layer 211 or the given one of the peripheral device structures 104; and a second wiring layer 301 and a second conductive plug 302, where the second wiring layer 301 is positioned above each of the capacitor structures 103 and the first wiring layer 201, the second conductive plug 302 is positioned between the second wiring layer 301 and the substrate 100, a terminal of the second conductive plug 302 is electrically connected to the second wiring layer 301, and other terminal of the second conductive plug 302 is electrically connected to a given one of the capacitor structures 103 or the second wiring sub-layer 221. A top surface of the first wiring layer 201 is lower than the top surface of each of the capacitor structures 103.

By means of the first wiring layer 201 and the first conductive plug 202, an electrical connection port of the peripheral device structure 104 may be rewired first and then electrically connected to other devices. The first wiring layer 201 includes a first wiring sub-layer 211 and a second wiring sub-layer 221, and the first conductive plug 202 includes a first conductive sub-plug 212 and a second conductive sub-plug 222, where a terminal of the first conductive sub-plug 212 is electrically connected to the first wiring sub-layer 211, and other terminal of the first conductive sub-plug 212 is electrically connected to the peripheral device structure 104; and a terminal of the second conductive sub-plug 222 is electrically connected to the second wiring sub-layer 221, and other terminal of the second conductive sub-plug 222 is electrically connected to the capacitor structure 103 or the first wiring sub-layer 211. The first wiring layer 201 may be further set in a multi-layer form, such that the other terminal of the conductive plug electrically connected to the peripheral device structure 104 is connected to different wiring layers, and thus the first wiring sub-layer 211 and the second wiring sub-layer 221 may jointly share the conductive plugs electrically connected to the peripheral device structure 104, thereby reducing distribution density of the conductive plugs in the peripheral region 101, avoiding a short circuit caused by a higher density of the conductive plugs, reducing wiring density for the first wiring sub-layer 211 and the second wiring sub-layer 221, and improving transmission efficiency for the first wiring sub-layer 211 and the second wiring sub-layer 221. Furthermore, the devices in the array region 102 and the peripheral region 101 may be rewired and electrically connected by means of the second wiring layer 301 and the second conductive plug 302, where the second conductive plug 302 only needs to be connected to the second wiring sub-layer 221 to implement electrical connection to the peripheral device structure 104, thereby reducing length and number of the second conductive plugs 302, and reducing difficulty of fabrication process of the second conductive plug 302. Moreover, the wiring density of the second wiring layer 301 is accordingly reduced, thereby reducing the process difficulty and improving the transmission efficiency of the second wiring layer 301. The top surface of the first wiring layer 201 is lower than the top surface of the capacitor structure 103. Before the capacitor structure 103 in the array region 102 is fabricated, the capacitor structure 103 may be formed after the first wiring layer 201 is formed in the peripheral region 101, to avoid causing adverse effects on the fabrication processes of the first wiring layer 201 and the first conductive plug 202 caused by an excessive height difference between the capacitor structure 103 in the array region 102 and the peripheral device structure 104 in the peripheral region 101.

For the substrate 100, a material of the substrate 100 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

For the array region 102, in some embodiments, the array region 102 further includes a memory transistor 106 and a capacitor contact 105, where the capacitor contact 105 is positioned under the capacitor structure 103, a terminal of the capacitor contact 105 is electrically connected to the memory transistor 106, other terminal of the capacitor contact 105 is electrically connected to the capacitor structure 103, and a top height of the first wiring sub-layer 211 is flush with a top height of the capacitor contact 105. In this embodiment, a material of the first wiring sub-layer 211 may be the same as that of the capacitor contact 105, and represented by the same features. In other embodiments, the material of the first wiring sub-layer 211 may be different from that of the capacitor contact 105. When the top of the first wiring sub-layer 211 is flush with the top of the capacitor contact 105, and the material of the first wiring sub-layer 211 is the same as that of the capacitor contact 105, the capacitor contact 105 may be formed simultaneously in the process of fabricating the first wiring sub-layer 211, thereby reducing fabrication process steps of the semiconductor structure, and improving fabrication efficiency of the semiconductor structure.

For the capacitor structure, the capacitor structure may include: a lower electrode layer, a capacitor dielectric layer, and an upper electrode layer. The lower electrode layer is positioned on a surface of the capacitor contact, the capacitor dielectric layer covers a surface of the lower electrode layer, and the upper electrode layer covers a surface of the capacitor dielectric layer.

For the lower electrode layer and the upper electrode layer, materials for forming the lower electrode layer and materials for forming the upper electrode layer may include at least one of nickel-platinum compound, titanium, tantalum, cobalt, polysilicon, copper, tungsten, tantalum nitride, titanium nitride, or ruthenium. For the capacitor dielectric layer, materials for forming the capacitor dielectric layer include high dielectric constant materials such as silicon oxide, tantalum oxide, hafnium oxide, zirconium oxide, niobium oxide, titanium oxide, barium oxide, strontium oxide, yttrium oxide, lanthanum oxide, praseodymium oxide or barium strontium titanate, etc.

For the capacitor contact, materials of the capacitor contact include copper, titanium, titanium nitride or tungsten, etc.

For the peripheral region 101, the peripheral region 101 has the peripheral device structure 104 for controlling the array region 102, and the peripheral device structure 104 can implement a write or read operation to memory cells in the array region 102.

For the peripheral device structure, the peripheral device structure includes a peripheral transistor structure, and the corresponding first conductive sub-plug and the corresponding second conductive sub-plug may be electrically connected to a gate, a source or a drain of the peripheral transistor.

For the first wiring layer and the second wiring layer, materials of the first wiring layer and materials of the second wiring layer include copper, titanium, titanium nitride or tungsten, etc. Accordingly, materials of the first wiring sub-layer and materials of the second wiring sub-layer include copper, titanium, titanium nitride or tungsten, etc.

For the first conductive plug and the second conductive plug, materials of the first conductive plug and materials of the second conductive plug both include titanium, titanium nitride or tungsten, etc. Accordingly, materials of the first conductive sub-plug and materials of the second conductive sub-plugs include titanium, titanium nitride or tungsten, etc.

It should be noted that, in the accompanying drawings provided in this embodiment, the layout of the first wiring layer, the first conductive plug, the second wiring layer and the second conductive plug is only an example provided for convenience of description, and does not limit the actual layout of the first wiring layer, the first conductive plug, the second wiring layer and the second conductive plug. The layout and routing of the first wiring layer, the first conductive plug, the second wiring layer and the second conductive plug may be designed according to the actual situations.

In this embodiment, the material of the first conductive plug and the material of the first wiring layer are the same and represented by the same feature. That is, the material of the first wiring sub-layer is the same as that of the first conductive sub-plug, the material of the second wiring sub-layer is the same as that of the second conductive sub-plug, the material of the first wiring sub-layer is the same as that of the second wiring sub-layer, then the conductive plug and the wiring layer connected correspondingly may be formed in the same fabrication process, thereby reducing the fabrication process of the semiconductor structure. In some other embodiments, the material of the first wiring sub-layer is different from that of the first conductive sub-plug, and the material of the second wiring sub-layer is different from that of the second conductive sub-plug, and the material of the second wiring layer is different from that of the second conductive plug. For example, the material of the first wiring sub-layer, the material of the second wiring sub-layer, and the material of the second wiring layer are all tungsten, and the material of the first conductive sub-plug, the material of the second conductive sub-plug, and the material of the second conductive plug are all copper, such that after the conductive plugs are formed, a tungsten metal layer may be formed at the top of the conductive plugs, and then the tungsten metal layer may be patterned to form corresponding wiring layers.

In some embodiments, the thickness of the first wiring sub-layer and the thickness of the second wiring sub-layer both range from 100 Å to 350 Å. It is to be understood that, when the thickness of the first wiring sub-layer and the thickness of the second wiring sub-layer are too large, a resistance of the corresponding wiring layer itself is larger, which is disadvantageous to data transmission of the wiring layer. When the thickness of the first wiring sub-layer and the thickness of the second wiring sub-layer are too small, it is disadvantageous to circuit transmission of the wiring layer, thereby adversely affecting service performance of the semiconductor structure. Therefore, the thickness of the first wiring sub-layer and the thickness of the second wiring sub-layer need to be adjusted according to actual situations, thereby preventing the performance of the semiconductor structure from being adversely affected.

In some embodiments, the height of the first conductive sub-plug ranges from 300 Å to 1,000 Å, and the height of the second conductive sub-plug ranges from 200 Å to 1,500 Å. It is to be understood that, the first conductive sub-plug is configured to electrically connect the first wiring sub-layer to the peripheral device structure. Because a height from the gate of the transistor structure in the peripheral device structure to the first wiring sub-layer is different from a height from the source or the drain of the transistor structure to the first wiring sub-layer, to avoid electric leakage between the first wiring sub-layer and the transistor structure, the height of the first conductive sub-plug corresponding to the shortest pitch from the first wiring sub-layer to the transistor structure needs to be greater than 300 Å. The second conductive sub-plug is configured to connect the first wiring sub-layer or the peripheral device structure to the second wiring sub-layer. When the first conductive sub-plug is longer, correspondingly, the pitch from the first wiring sub-layer to the peripheral device structure is larger. Because the second wiring sub-layer is positioned on the first wiring sub-layer, when the second conductive sub-plug needs to be connected to the peripheral device structure, the height of the corresponding second conductive sub-plug increases. Therefore, when the height of the first conductive sub-plug is too high, it is disadvantageous to the fabrication process of the second conductive sub-plug. Therefore, both the first conductive sub-plug and the second conductive sub-plug need to be adjusted within a certain range, to reduce the distribution density of the conductive plugs in the peripheral region, causing less burden on the fabrication process of the semiconductor structure, and improving the service performance and stability of the semiconductor structure.

In some embodiments, the thickness of the second wiring layer ranges from 150 Å to 450 Å, and the height of the second conductive plug ranges from 200 Å to 11,000 Å. The second wiring layer is configured to rewire and electrically connect the device structure in the peripheral region and the device structure in the array region. The larger the thickness of the second wiring layer, the greater the resistance in the second wiring layer correspondingly. The thickness of the second wiring layer is too small, which is not conductive to the circuit transmission in the second wiring layer, so the thickness of the second wiring layer needs to be correspondingly adjusted according to actual situations. The second conductive plug is configured to electrically connect the second wiring sub-layer or the capacitor structure to the second wiring layer. Because the height difference between the capacitor structure in the array region and the peripheral device structure in the peripheral region is larger, a height range of the second conductive plug is larger, and accordingly, the second conductive plug having an appropriate height may be selected according to needs.

Referring to FIG. 1, in some embodiments, the semiconductor structure further includes a first insulating layer 401 covering each of the peripheral device structures 104 and filling a gap between the peripheral device structures 104 in the peripheral region 101. The first conductive plug 202 is positioned in the first insulating layer 401, and the first insulating layer 401 also covers the memory transistors 106 in the array region 102 and fills the gap between the memory transistors 106 in the array region 102. Adversely The first insulating layer 401 may isolate the adjacent peripheral device structures 104 and the adjacent memory transistors 106 to avoid conduction between the adjacent peripheral device structures 104 or conduction between the adjacent memory transistors 106, thereby avoiding causing damages to the semiconductor structure. Meanwhile, the first insulating layer 401 may isolate the adjacent first conductive plugs 202, to prevent the service performance of the semiconductor structure from being adversely affected by conduction between the adjacent first conductive plugs 202.

Further, the first insulating layer 401 includes: a first dielectric layer 411 covering each of the peripheral device structures 104 and filling the gap between the peripheral device structures 104 in the peripheral region 101, where the first dielectric layer 411 also covers the memory transistors 106 in the array region 102 and fills the gap between the memory transistors 106 in the array region 102, and the first conductive sub-plug 212 is positioned in the first dielectric layer 411; and a second dielectric layer 412 positioned on a top surface of the first dielectric layer 411 in the peripheral region 101, where the second dielectric layer 412 is also positioned on a top surface of the first dielectric layer 411 in the array region 102, the second conductive sub-plug 222 is positioned in the second dielectric layer 412, and part of the second conductive sub-plug 222 is further positioned in the first dielectric layer 411. The first dielectric layer 411 covers the peripheral device structures 104 and fills the gap between the peripheral device structures 104 in the peripheral region 101, and further covers the memory transistors 106 in the array region 102 and fills the gap between the memory transistors 106 in the array region 102. In the process of fabricating the first conductive sub-plug 212 and the first wiring sub-layer 211, the capacitor contact 105 in the array region 102 may be fabricated simultaneously, thereby reducing the fabrication process of the semiconductor structure, and improving the fabrication efficiency of the semiconductor structure. The second dielectric layer 412 is positioned on the top surface of the first dielectric layer 411, and the second dielectric layer 412 may be patterned to form the second conductive sub-plug 222 electrically connected to the first wiring sub-layer 211; or, the first dielectric layer 411 and the second dielectric layer 412 may be patterned simultaneously to form the second conductive sub-plug 222 electrically connected to the peripheral device structure 104.

For the first insulating layer 401, the first dielectric layer 411 and the second dielectric layer 412, materials of the first insulating layer 401, the first dielectric layer 411 and the second dielectric layer 412 all include silicon oxide, silicon nitride, silicon oxynitride or SiCN, etc. In this embodiment, the materials of the first dielectric layer 411 are the same as the materials of the second dielectric layer 412, and are represented by the same features. In other embodiments, the materials of the first dielectric layer 411 may be different from the materials of the second dielectric layer 412.

With continued reference to FIG. 1, in some embodiments, the semiconductor structure further includes: a second insulating layer 402 covering a surface of the first wiring layer 201 in the peripheral region 101, and covering and filling a gap between the capacitor structures 103 in the array region 102, where the second conductive plug 302 is positioned in the second insulating layer 402. The second insulating layer 402 covers the surface of the first wiring layer 201, and covers and fills the gap between the capacitor structures 103, thereby facilitating simultaneous fabrication of the second conductive plugs 302 in the peripheral region 101 and the array region 102; and the second insulating layer 402 may isolate the adjacent second conductive plugs 302, thereby avoiding mutual communication between the adjacent second conductive plugs 302, and improving the stability of the semiconductor structure.

For the second insulating layer 402, materials of the second insulating layer 402 include silicon oxide, silicon nitride, silicon oxynitride or SiCN, and the like. In this embodiment, the materials of the second insulating layer 402 are the same as the materials of the first insulating layer 401, and are represented by the same features. In other embodiments, the materials of the second insulating layer may be different from the materials of the first insulating layer.

In some embodiments, the first wiring layer further includes a third wiring sub-layer, and the first conductive plug further includes a third conductive sub-plug, where the third wiring sub-layer is positioned between the first wiring sub-layer and the second wiring layer. A terminal of part of the third conductive sub-plug is electrically connected to the third wiring sub-layer, and other terminal of the part of the third conductive sub-plug is electrically connected to a given one of the peripheral device structures or the first wiring sub-layer. A terminal of other part of the third conductive sub-plug is electrically connected to the third wiring sub-layer, and other terminal of the other part of the third conductive sub-plug is electrically connected to the second wiring sub-layer. By arranging the third wiring sub-layer and the third conductive sub-plug, different conductive sub-plugs in the peripheral region may be further electrically connected to different wiring sub-layers, such that the loads of different wiring sub-layers may be reduced, and the distribution density of the conductive sub-plugs may be reduced correspondingly, thereby balancing the wiring density of different wiring sub-layers, and improving the transmission efficiency of the first wiring layer and the first conductive plug.

Based on the method for additionally providing the third wiring sub-layer and the third conductive sub-plug in the above embodiment, in some embodiments, a plurality of wiring sub-layers and conductive sub-plugs may further be provided in the first wiring layer. For example, there may be 4, 6, or 10 wiring sub-layers, such that different conductive sub-plugs are electrically connected to different wiring sub-layers respectively, thereby reducing the wiring density of a single layer of the wiring sub-layer and the distribution density of the corresponding conductive sub-plug, and improving the service performance of the first wiring layer and the first conductive plug.

In the semiconductor structure provided by the embodiments of the present disclosure, by means of the first wiring layer and the first conductive plug, an electrical connection port of the peripheral device structure may be rewired first and then electrically connected to other devices. The first wiring layer includes a first wiring sub-layer and a second wiring sub-layer, and the first conductive plug includes a first conductive sub-plug and a second conductive sub-plug, where a terminal of the first conductive sub-plug is electrically connected to the first wiring sub-layer, and other terminal of the first conductive sub-plug is electrically connected to the peripheral device structure; and a terminal of the second conductive sub-plug is electrically connected to the second wiring sub-layer, and other terminal of the second conductive sub-plug is electrically connected to the capacitor structure or the first wiring sub-layer. The first wiring layer may be further set in a multi-layer form, such that the other terminal of the conductive plug electrically connected to the peripheral device structure is connected to different wiring layers, and thus the first wiring sub-layer and the second wiring sub-layer may jointly share the conductive plugs electrically connected to the peripheral device structure, thereby reducing distribution density of the conductive plugs in the peripheral region, avoiding a short circuit caused by a higher density of the conductive plugs, reducing wiring density for the first wiring sub-layer and the second wiring sub-layer, and improving transmission efficiency for the first wiring sub-layer and the second wiring sub-layer. Furthermore, the devices in the array region and the peripheral region may be rewired and electrically connected by means of the second wiring layer and the second conductive plug, where the second conductive plug only needs to be connected to the second wiring sub-layer to implement electrical connection to the peripheral device structure, thereby reducing length and number of the second conductive plugs, and reducing difficulty of fabrication process of the second conductive plug. Moreover, the wiring density of the second wiring layer is accordingly reduced, thereby reducing the process difficulty and improving the transmission efficiency of the second wiring layer. The top surface of the first wiring layer is lower than the top surface of the capacitor structure. Before the capacitor structure in the array region is fabricated, the capacitor structure may be formed after the first wiring layer is formed in the peripheral region, to avoid causing adverse effects on the fabrication processes of the first wiring layer and the first conductive plug caused by an excessive height difference between the capacitor structure in the array region and the peripheral device structure in the peripheral region.

Another embodiment of the present disclosure provides a method for fabricating a semiconductor structure, which may be configured for forming the above-mentioned semiconductor structure, to improve the distribution density of conductive plugs in the peripheral region. It should be noted that reference may be made to the detailed description of the foregoing embodiments for the same or corresponding parts as the previous embodiment, which is not described in detail herein.

FIGS. 2 to 7 are schematic structural diagrams corresponding to steps of a method for fabricating a semiconductor structure according to another embodiment of the present disclosure. The method for fabricating the semiconductor structure provided in this embodiment will be described in detail below with reference to the accompanying drawings, and details are as follows.

Figure 2:
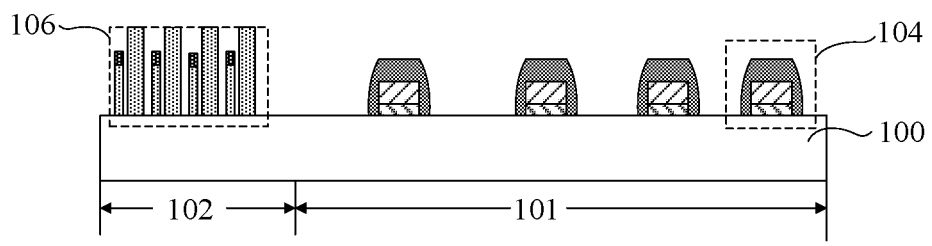
FIGS. 2 to 7 are schematic structural diagrams corresponding to steps of a method for fabricating a semiconductor structure according to another embodiment of the present disclosure.

Referring to FIG. 2, a substrate 100 is provided, and the substrate 100 includes a peripheral region 101 including peripheral device structures 104 therein and an array region 102 having memory transistors 106 therein.

Figure 3:
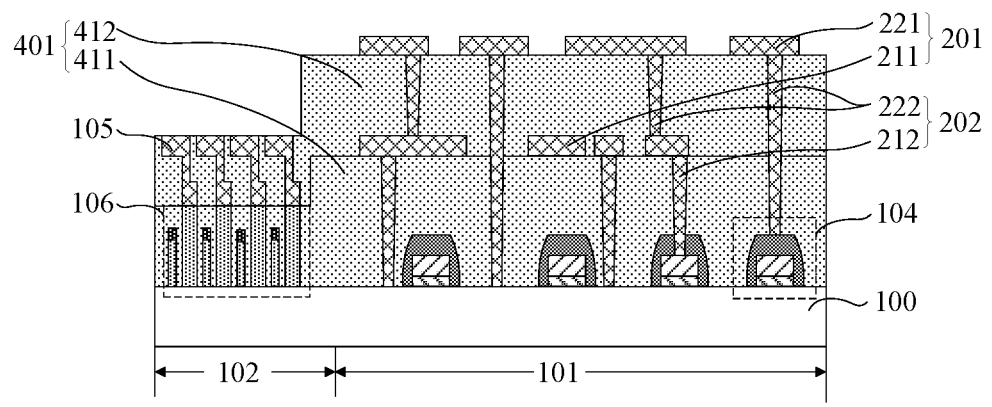

Referring to FIG. 3, a first wiring layer 201 and a first conductive plug 202 are formed, where the first wiring layer 201 at least includes a first wiring sub-layer 211 and a second wiring sub-layer 221, and the first conductive plug 202 at least includes a first conductive sub-plug 212 and a second conductive sub-plug 222. The first wiring sub-layer 211 is positioned above the peripheral device structure 104, and the first conductive sub-plug 212 is positioned between the first wiring sub-layer 211 and the peripheral device structure 104. A terminal of the first conductive sub-plug 212 is electrically connected to the first wiring sub-layer 211, other terminal of the first conductive sub-plug 212 is electrically connected to the peripheral device structure 104. The second wiring sub-layer 221 is positioned above the first wiring sub-layer 211, and the second conductive sub-plug 222 is positioned between the second wiring sub-layer 221 and the peripheral device structure 104. A terminal of the second conductive sub-plug 222 is electrically connected to the second wiring sub-layer 221, and other terminal of the second conductive sub-plug 222 is electrically connected to the first wiring sub-layer 211 or the peripheral device structures 104.

Figure 4:
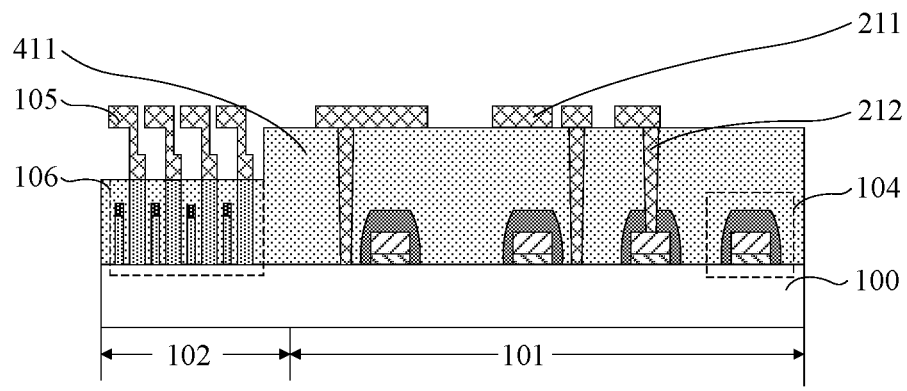
Figure 5:
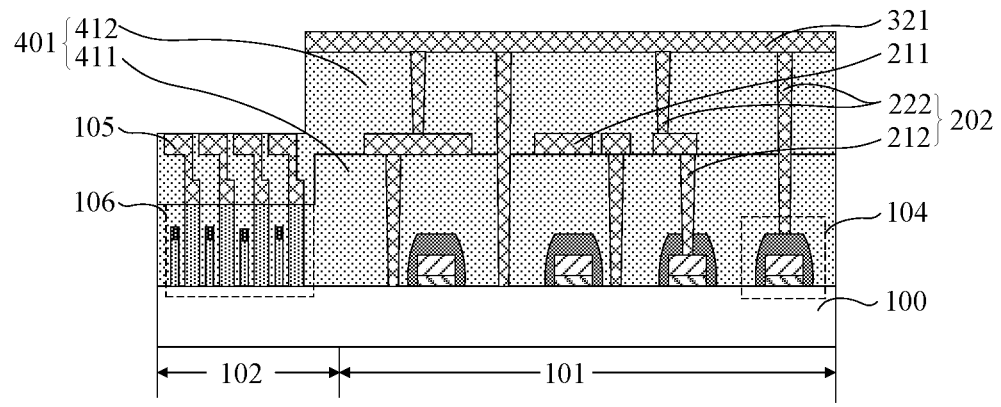

In some embodiments, the process step of forming the first wiring layer 201 and the first conductive plug 202 includes: referring to FIG. 4, forming a first dielectric layer 411 covering each of the peripheral device structures 104 and filling a gap between the peripheral device structures 104 in the peripheral region 101; patterning the first dielectric layer 411 to form a first conductive sub-hole; filling a first conductive material to form the first conductive sub-plug 212 in the first conductive sub-hole and to form a first initial wiring sub-layer on a top surface of the first dielectric layer 411, and meanwhile, forming an initial capacitor contact layer on the memory transistor 106 in the array region; patterning the first initial wiring sub-layer to form the first wiring sub-layer 211, and meanwhile, patterning the initial capacitor contact layer to form the capacitor contact 105, where the top surface of the capacitor contact 105 is flush with the top surface of the first wiring sub-layer 211; referring to FIG. 5, forming a second dielectric layer 412 on the first dielectric layer 411, where the second dielectric layer 412 covers a surface of the first wiring sub-layer 211 and fills a gap between the first wiring sub-layers 211, and the second dielectric layer 412 also fills the gap between the capacitor contacts 105; patterning the second dielectric layer 412 and the first dielectric layer 411 to form a second conductive sub-hole; filling a second conductive material to form a second conductive sub-plug 222 in the second conductive sub-hole and to form a second initial wiring sub-layer 321 on a top surface of the second dielectric layer 412; and still referring to FIG. 3, patterning the second initial wiring sub-layer 321 to form the second wiring sub-layer 221, where a remaining part of the first dielectric layer 411 and a remaining part of the second dielectric layer 412 jointly constitute a first insulating layer 401.

In some other embodiments, the process step of forming the first wiring layer and the first conductive plug includes: forming a first dielectric layer covering each of the peripheral device structures and filling a gap between the peripheral device structures in the peripheral region; patterning the first dielectric layer to form a first conductive sub-hole and a first wiring sub-groove communicated to each other; filling a first conductive material in the first conductive sub-hole and the first wiring sub-groove to form the first conductive sub-hole and the first wiring sub-layer; forming a second dielectric layer on a surface of the first dielectric layer, and patterning the second dielectric layer and the first dielectric layer to form a second conductive sub-hole and a second wiring sub-groove communicated to each other; filling a second conductive material in the second conductive sub-hole and the second wiring sub-groove to form a second conductive sub-plug and a second initial wiring sub-layer. That is, the first conductive sub-hole and the first wiring sub-layer may be formed in the same process step, and the second conductive sub-hole and the second wiring sub-layer may be formed in the same process step. In this way, the fabrication processes of the semiconductor structure are reduced, and the fabrication efficiency of the semiconductor structure is improved.

For the first conductive material and the second conductive material, both the first conductive material and the second conductive material include copper, titanium, titanium nitride, tungsten, or the like. In this embodiment, the first conductive material is the same as the second conductive material. That is, the materials of the first conductive sub-plug are the same as those of the second conductive sub-plug, and are represented by the same features. In other embodiments, the first conductive material may be different from the second conductive material. That is, the materials of the first conductive sub-plug are different from the materials of the second conductive sub-plug.

In this embodiment, the materials of the first wiring sub-layer are the same as those of the first conductive plug, the materials of the second wiring sub-layer are the same as those of the second conductive sub-plug, and the materials of the first conductive sub-plug are the same as those of the second conductive sub-plug, and are represented by the same features. In other embodiments, the materials of the first wiring sub-layer may be different from those of the first conductive plugs, the materials of the second wiring sub-layer may be different from those of the second conductive sub-plug, and the materials of the first conductive sub-plug may be different from those of the second conductive sub-plug.

Figure 6:
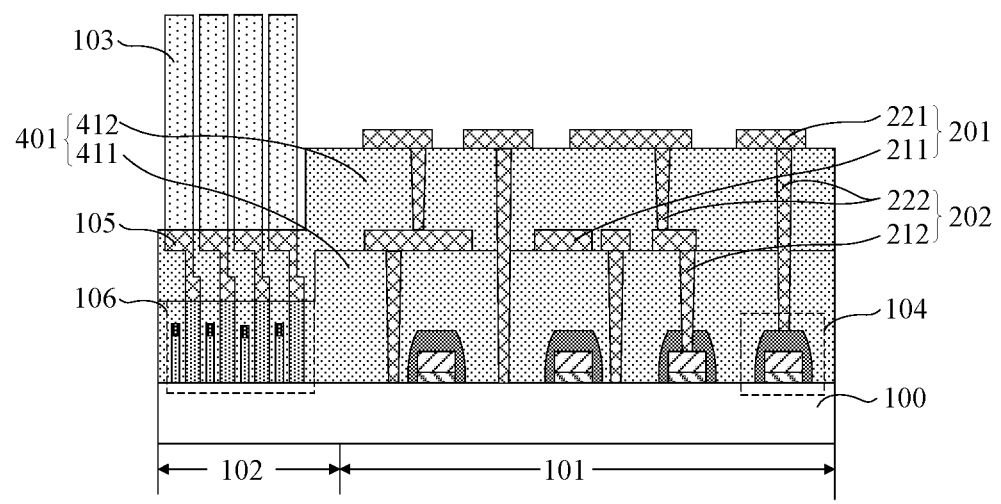

Referring to FIG. 6, a capacitor structure 103 is formed, and the capacitor structure 103 is positioned in the array region 102, where the top surface of the first wiring layer 201 is lower than the top surface of the capacitor structure 103.

Figure 7:
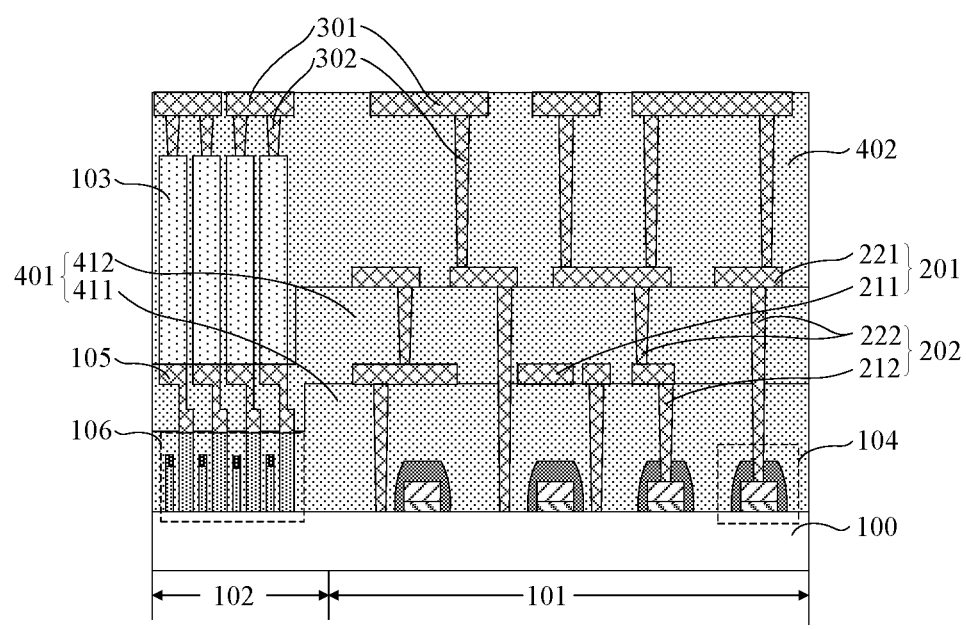

Referring to FIG. 7, a second wiring layer 301 and a second conductive plug 302 are formed. The second wiring layer 301 is positioned above the capacitor structure 103 and the first wiring layer 201, and the second conductive plug 302 is positioned between the second wiring layer 301 and the substrate 100. A terminal of the second conductive plug 302 is electrically connected to the second wiring layer 301, and other terminal of the second conductive plug 302 is electrically connected to the capacitor structure 103 or the second wiring sub-layer 221.

In some embodiments, the process step of forming the second wiring layer 301 and the second conductive plug 302 comprises: forming a second insulating layer 402, where the second insulating layer 402 covers the surface of the first wiring layer 201 in the peripheral region 101, and covers and fills a gap between the capacitor structures 103 in the array region 102; patterning the second insulating layer 402 positioned in the peripheral region 101 and the array region 102 to form a conductive hole and a wiring groove communicated with each other, where the conductive hole exposes a surface of the second wiring sub-layer 221 and exposes a surface of a given one of the capacitor structures 103; filling the conductive hole with a third conductive material to form the second conductive plug 302; and filling the wiring groove with a fourth conductive material to form the second wiring layer 301.

For the third conductive material and the fourth conductive material, both the third conductive material and the fourth conductive material include copper, titanium, titanium nitride, tungsten, or the like. In this embodiment, the third conductive material is the same as the fourth conductive material. That is, the material of the second conductive plug and the material of the second wiring layer are the same and represented by the same feature, such that the second conductive plug and the second wiring layer may be formed in the same process step to improve the fabrication efficiency of the semiconductor structure. In other embodiments, the third conductive material and the fourth conductive material may be different. That is, the material of the second conductive plug and the material of the second wiring layer are different.

In some other embodiments, the step of forming the second wiring layer and the second conductive plug comprises: forming a second insulating layer, where the second insulating layer covers the surface of the first wiring layer in the peripheral region, and covers and fills a gap between the capacitor structures in the array region; forming a plurality of conductive holes in the second insulating layer, and filling the conductive hole with a third conductive material to form the second conductive plug; forming an initial wiring layer, where the initial wiring layer covers the top surface of the second insulating layer; and patterning an initial second wiring layer to form the second wiring layer. In this way, the materials of the second wiring layer may be made different from the materials of the second conductive plug. For example, when the material of the second wiring layer is tungsten and the material of the second conductive plug is copper, after the second conductive plug is formed, a tungsten metal layer is formed directly on a top of the second conductive plug, and then the tungsten metal layer is patterned to form the second wiring layer.

In the method for fabricating the semiconductor structure provided by the embodiments of the present disclosure, by forming the first wiring layer 201 and the first conductive plug 202, an electrical connection port of the peripheral device structure 104 may be rewired first and then electrically connected to other devices. The first wiring layer 201 includes a first wiring sub-layer 211 and a second wiring sub-layer 221, and the first conductive plug 202 includes a first conductive sub-plug 212 and a second conductive sub-plug 222, where a terminal of the first conductive sub-plug 212 is electrically connected to the first wiring sub-layer 211, and other terminal of the first conductive sub-plug 212 is electrically connected to the peripheral device structure 104; and a terminal of the second conductive sub-plug 222 is electrically connected to the second wiring sub-layer 221, and other terminal of the second conductive sub-plug 222 is electrically connected to the capacitor structure 103 or the first wiring sub-layer 211. The first wiring layer 201 may be further set in a multi-layer form, such that the other terminal of the conductive plug electrically connected to the peripheral device structure 104 is connected to different wiring layers, and thus the first wiring sub-layer 211 and the second wiring sub-layer 221 may jointly share the conductive plugs electrically connected to the peripheral device structure 104, thereby reducing distribution density of the conductive plugs in the peripheral region 101, avoiding a short circuit caused by a higher density of the conductive plugs, reducing wiring density for the first wiring sub-layer 211 and the second wiring sub-layer 221, and improving transmission efficiency for the first wiring sub-layer 211 and the second wiring sub-layer 221. Furthermore, the devices in the array region 102 and the peripheral region 101 may be rewired and electrically connected by means of the second wiring layer 301 and the second conductive plug 302, where the second conductive plug 302 only needs to be connected to the second wiring sub-layer 221 to implement electrical connection to the peripheral device structure 104, thereby reducing length and number of the second conductive plugs 302, and reducing difficulty of fabrication process of the second conductive plug 302. Moreover, the wiring density of the second wiring layer 301 is accordingly reduced, thereby reducing the process difficulty and improving the transmission efficiency of the second wiring layer 301. The top surface of the first wiring layer 201 is lower than the top surface of the capacitor structure 103. Before the capacitor structure 103 in the array region 102 is fabricated, the capacitor structure 103 may be formed after the first wiring layer 201 is formed in the peripheral region 101, to avoid causing adverse effects on the fabrication processes of the first wiring layer 201 and the first conductive plug 202 caused by an excessive height difference between the capacitor structure 103 in the array region 102 and the peripheral device structure 104 in the peripheral region 101.

Those of ordinary skill in the art can understand that the above-mentioned embodiments are some embodiments for realizing the present disclosure, but in practical applications, various changes may be made to them in form and details without departing from the spirit and scope of the present disclosure.

What is claimed is:

1. A semiconductor structure, comprising:
a substrate comprising a peripheral region and an array region, the array region having capacitor structures, the peripheral region having peripheral device structures, and a top surface of each of the capacitor structures being higher than a top surface of each of the peripheral device structures;
a first wiring layer and first conductive plugs, the first wiring layer at least comprising a first wiring sub-layer and a second wiring sub-layer, the first conductive plugs at least comprising a first conductive sub-plugs and second conductive sub-plugs, the first wiring sub-layer being positioned above the peripheral device structures, the first conductive sub-plugs being positioned between the first wiring sub-layer and the peripheral device structures, first terminals of the first conductive sub-plugs being electrically connected to the first wiring sub-layer, second terminals of the first conductive sub-plugs being electrically connected to the peripheral device structures, the second wiring sub-layer being positioned above the first wiring sub-layer, the second conductive sub-plugs being positioned between the second wiring sub-layer and the peripheral device structures, first terminals of the second conductive sub-plugs being electrically connected to the second wiring sub-layer, and second terminals of the second conductive sub-plugs including second terminals of a first set of the second conductive sub-plugs being directly contact with the first wiring sub-layer and second terminals of a second set of the second conductive sub-plugs being directly contact with the peripheral device structures; and
a second wiring layer and second conductive plugs, the second wiring layer being positioned above the capacitor structures and the first wiring layer, the second conductive plugs being positioned between the second wiring layer and the substrate, first terminals of the second conductive plugs being electrically connected to the second wiring layer, and second terminals of the second conductive plugs being electrically connected to the capacitor structures or the second wiring sub-layer;

wherein a top surface of the first wiring layer is lower than the top surface of each of the capacitor structures.

2. The semiconductor structure according to claim 1, wherein the array region further comprises a memory transistor and a capacitor contact, the capacitor contact being positioned under a given one of the capacitor structures, a terminal of the capacitor contact being electrically connected to the memory transistor, other terminal of the capacitor contact being electrically connected to the given one of the capacitor structures, and a top height of the first wiring sub-layer being flush with a top height of the capacitor contact.

3. The semiconductor structure according to claim 2, wherein a material of the first wiring sub-layer is same as a material of the capacitor contact.

4. The semiconductor structure according to claim 1, further comprising:
a first insulating layer covering each of the peripheral device structures and filling a gap between the peripheral device structures in the peripheral region, the first conductive plugs being positioned in the first insulating layer.

5. The semiconductor structure according to claim 4, wherein the first insulating layer comprises:
a first dielectric layer covering each of the peripheral device structures and filling the gap between the peripheral device structures in the peripheral region, and the first conductive sub-plugs being positioned in the first dielectric layer; and
a second dielectric layer positioned on a top surface of the first dielectric layer in the peripheral region, the second conductive sub-plugs being positioned in the second dielectric layer, and the second set of the second conductive sub-plugs being further positioned in the first dielectric layer.

6. The semiconductor structure according to claim 1, further comprising:
a second insulating layer covering a surface of the first wiring layer in the peripheral region, and covering and filling a gap between the capacitor structures in the array region, the second conductive plug being positioned in the second insulating layer.

7. The semiconductor structure according to claim 1, wherein a thickness of the first wiring sub-layer and a thickness of the second wiring sub-layer both range from 100 Å to 350 Å.

8. The semiconductor structure according to claim 1, wherein heights of the first conductive sub-plugs range from 300 Å to 1,000 Å, and heights of the second conductive sub-plugs range from 200 Å to 1,500 Å.

9. The semiconductor structure according to claim 1, wherein a thickness of the second wiring layer ranges from 150 Å to 450 Å, and a height of the second conductive plug ranges from 200 Å to 11,000 Å.

10. The semiconductor structure according to claim 1, wherein materials of the first conductive plugs are same as a material of the first wiring layer.

11. The semiconductor structure according to claim 1, wherein the first wiring layer further comprises a third wiring sub-layer, and the first conductive plugs further comprise a third conductive sub-plug, the third wiring sub-layer being positioned between the first wiring sub-layer and the second wiring sub-layer, a terminal of part of the third conductive sub-plug being electrically connected to the third wiring sub-layer, and other terminal of the part of the third conductive sub-plug being electrically connected to given one of the peripheral device structures or the first wiring sub-layer; a terminal of other part of the third conductive sub-plug being electrically connected to the third wiring sub-layer, and other terminal of the other part of the third conductive sub-plug being electrically connected to the second wiring sub-layer.

12. A method for fabricating a semiconductor structure, comprising:
providing a substrate, the substrate comprising a peripheral region and an array region, and the peripheral region comprising peripheral device structures;
forming a first wiring layer and first conductive plugs, the first wiring layer at least comprising a first wiring sub-layer and a second wiring sub-layer, the first conductive plugs at least comprising first conductive sub-plugs and second conductive sub-plugs, the first wiring sub-layer being positioned above each of the peripheral device structures, the first conductive sub-plugs being positioned between the first wiring sub-layer and the peripheral device structures, first terminals of the first conductive sub-plugs being electrically connected to the first wiring sub-layer, second terminals of the first conductive sub-plugs being electrically connected to the peripheral device structures, the second wiring sub-layer being positioned above the first wiring sub-layer, the second conductive sub-plugs being positioned between the second wiring sub-layer and the peripheral device structures, first terminals of the second conductive sub-plugs being electrically connected to the second wiring sub-layer, and second terminals of the second conductive sub-plugs including second terminals of a first set of the second conductive sub-plugs being directly contact with the first wiring sub-layer and second terminals of a second set of the second conductive sub-plugs being directly contact with the peripheral device structures;
forming capacitor structures, the capacitor structures being positioned in the array region, wherein a top surface of the first wiring layer is lower than a top surface of each of the capacitor structures; and
forming a second wiring layer and second conductive plugs, the second wiring layer being positioned above the capacitor structures and the first wiring layer, the second conductive plugs being positioned between the second wiring layer and the substrate, first terminals of the second conductive plugs being electrically connected to the second wiring layer, and second terminals of the second conductive plugs being electrically connected to the capacitor structures or the second wiring sub-layer.

13. The method for fabricating the semiconductor structure according to claim 12, wherein the forming the first wiring layer and the first conductive plugs comprises:
forming a first dielectric layer, the first dielectric layer covering each of the peripheral device structures and filling a gap between the peripheral device structures in the peripheral region;
patterning the first dielectric layer to form first conductive sub-holes;
filling a first conductive material to form the first conductive sub-plugs in the first conductive sub-holes and to form a first initial wiring sub-layer on a top surface of the first dielectric layer;
patterning the first initial wiring sub-layer to form the first wiring sub-layer;

forming a second dielectric layer on the first dielectric layer, the second dielectric layer covering a surface of the first wiring sub-layer and filling a gap between the first wiring sub-layers;

patterning the second dielectric layer and the first dielectric layer to form second conductive sub-holes;

filling a second conductive material to form a second conductive sub-plugs in the second conductive sub-holes and to form a second initial wiring sub-layer on a top surface of the second dielectric layer; and patterning the second initial wiring sub-layer to form the second wiring sub-layer, a remaining part of the first dielectric layer and a remaining part of the second dielectric layer jointly constituting a first insulating layer.

14. The method for fabricating the semiconductor structure according to claim 13, wherein while a first conductive material is filled to form the first conductive sub-plugs in the first conductive sub-holes and to form the first initial wiring sub-layer on the top surface of the first dielectric layer, an initial capacitor contact layer is further formed on a memory transistor in the array region; and while the first initial wiring sub-layer is patterned to form the first wiring sub-layer, the initial capacitor contact layer is further patterned to form a capacitor contact, a top surface of the capacitor contact being flush with a top surface of the first wiring sub-layer.

15. The method for fabricating the semiconductor structure according to claim 12, wherein the forming the second wiring layer and the second conductive plug comprises:

forming a second insulating layer, the second insulating layer covering the surface of the first wiring layer in the peripheral region, and covering and filling a gap between the capacitor structures in the array region;

patterning the second insulating layer positioned in the peripheral region and the array region to form a conductive hole and a wiring groove communicated with each other, the second conductive hole exposing a surface of the second wiring sub-layer and exposing a surface of a given one of the capacitor structures;

filling the conductive hole with a third conductive material to form the second conductive plug; and filling the wiring groove with a fourth conductive material to form the second wiring layer.

16. A semiconductor structure, comprising:

a substrate comprising a peripheral region and an array region, the array region having capacitor structures, the peripheral region having peripheral device structures, and a top surface of each of the capacitor structures being higher than a top surface of each of the peripheral device structures;

a first wiring layer and first conductive plugs, the first wiring layer at least comprising a first wiring sub-layer and a second wiring sub-layer, the first wiring sub-layer being positioned above the peripheral device structures, the second wiring sub-layer being positioned above the first wiring sub-layer, the first conductive plugs being positioned between the first wiring layer and the peripheral device structures, terminals of the first conductive plugs being electrically connected to the first wiring layer or the peripheral device structures; and a second wiring layer and second conductive plugs, the second wiring layer being positioned above the capacitor structures and the first wiring layer, the second conductive plugs being positioned between the second wiring layer and the substrate, first terminals of the second conductive plugs being electrically connected to the second wiring layer, and second terminals of the second conductive plugs being electrically connected to a given one of the capacitor structures or the second wiring sub-layer;

wherein a top surface of the first wiring layer is lower than the top surface of each of the capacitor structures, and the second conductive plugs are not aligned with the first conductive plugs along a vertical direction.

17. The semiconductor structure according to claim 16, wherein the first conductive plugs at least comprises first conductive sub-plugs and second conductive sub-plugs, the first conductive sub-plugs are positioned between the first wiring sub-layer and the peripheral device structures, the second conductive sub-plugs are positioned between the second wiring sub-layer and the peripheral device structures, the second conductive sub-plugs are not aligned with the first conductive sub-plugs along a vertical direction.

18. The semiconductor structure according to claim 16, wherein heights of the first conductive plugs positioned between the first wiring sub-layer and the second wiring sub-layer are lower than heights of the first conductive plugs positioned between the first wiring sub-layer and the peripheral device structures.

19. The semiconductor structure according to claim 16, wherein a distribution density of the first conductive plugs positioned between the first wiring sub-layer and the second wiring sub-layer is lower than a distribution density of the first conductive plugs positioned between the first wiring sub-layer and the peripheral device structures.

20. The semiconductor structure according to claim 16, wherein the first wiring layer includes multiple portions arranged with non-equal spacings on a same horizontal level.

* * * * *